United States Patent
Chan et al.

(10) Patent No.: US 12,543,488 B2
(45) Date of Patent: Feb. 3, 2026

(54) DISPLAY DEVICES AND DISPLAY PANELS THEREOF

(71) Applicants: Chengdu BOE Optoelectronics Technology Co., Ltd., Sichuan (CN); BOE Technology Group Co., Ltd., Beijing (CN)

(72) Inventors: Yucheng Chan, Beijing (CN); Shuanzhu Li, Beijing (CN); Chengchung Yang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 513 days.

(21) Appl. No.: 17/922,479

(22) PCT Filed: Oct. 26, 2021

(86) PCT No.: PCT/CN2021/126481
§ 371 (c)(1),
(2) Date: Oct. 31, 2022

(87) PCT Pub. No.: WO2022/227446
PCT Pub. Date: Nov. 3, 2022

(65) Prior Publication Data
US 2024/0224773 A1    Jul. 4, 2024

(30) Foreign Application Priority Data
Apr. 28, 2021 (CN) .......................... 202110467347.7

(51) Int. Cl.
*H10K 59/131* (2023.01)
*H10K 77/10* (2023.01)
*H10K 102/00* (2023.01)

(52) U.S. Cl.
CPC ......... *H10K 77/111* (2023.02); *H10K 59/131* (2023.02); *H10K 2102/311* (2023.02)

(58) Field of Classification Search
CPC ............... H10K 77/111; H10K 59/131; H10K 2102/311; H10K 59/124; G09F 9/301
See application file for complete search history.

(56) References Cited

U.S. PATENT DOCUMENTS

2021/0097902 A1    4/2021  Hong et al.
2021/0336234 A1*  10/2021  Zheng .................. H10K 77/111
(Continued)

FOREIGN PATENT DOCUMENTS

CN         109003998 A      12/2018
CN         109560088 A       4/2019
(Continued)

OTHER PUBLICATIONS

PCT/CN2021/126481 international search report.
PCT/CN2021/126481 Written Opinion.

*Primary Examiner* — Christine S. Kim
*Assistant Examiner* — Andrew Victor Prostor
(74) *Attorney, Agent, or Firm* — IPro, PLLC

(57) ABSTRACT

The present disclosure provides a display device and a display panel thereof. The display panel includes a display region and a stretchable region located in at least one corner region of the display region, where the stretchable region is provided with a plurality of first holes, and the first holes are staggered from each other.

18 Claims, 8 Drawing Sheets

(56) References Cited

U.S. PATENT DOCUMENTS

2022/0102462 A1* 3/2022 Zhou ................ H10K 59/1201
2022/0115452 A1    4/2022 Hou et al.
2022/0165822 A1* 5/2022 Jia ..................... H10K 77/111

FOREIGN PATENT DOCUMENTS

| CN | 111276496 | A  | 6/2020  |
| CN | 111799392 | A  | 10/2020 |
| CN | 112133733 | A  | 12/2020 |
| CN | 112271196 | A  | 1/2021  |
| CN | 112310123 | A  | 2/2021  |
| CN | 213242598 | U  | 5/2021  |
| CN | 113193028 | A  | 7/2021  |
| WO | 2021227581 | A1 | 11/2021 |

* cited by examiner

DISPLAY DEVICES AND DISPLAY PANELS THEREOF

CROSS-REFERENCE TO RELATED APPLICATIONS

This application is a national stage of international PCT Application No. PCT/CN2021/126481 filed on Oct. 26, 2021, which claims priority to Chinese patent application No. 202110467347.7 filed on Apr. 28, 2021, the entire contents of which are incorporated herein by reference.

TECHNICAL FIELD

The present disclosure relates to the field of display device technologies, and in particular, to a display device and a display panel thereof.

BACKGROUND

Compared with currently widely applied liquid crystal and plasma displays, Organic Light-Emitting Diode (OLED) devices have attracted much attention due to their advantages such as self-luminescence, rich colors, fast response speed, wide viewing angle, light weight, thin thickness, low power consumption, and flexible display. Now, flexible OLED products are widely applied in mobile phones, Notebooks and other products.

With the diversity of product applications, customer demands for stretchable OLED products in mobile phone applications have gradually increased. In the related art, structural designs for stretchable regions of quadrilateral curved OLED products still have larger defects, and corners of the stretchable regions have obvious wavy wrinkles.

SUMMARY

The present disclosure provides a display device and a display panel thereof to solve deficiencies in related art.

To achieve the above-described purpose, according to a first aspect of embodiments of the present disclosure, there is provided a display panel, including: a display region and a stretchable region located in at least one corner region, where the stretchable region is provided with a plurality of first holes, and the first holes are staggered from each other.

In some embodiments, sections of the first holes perpendicular to a thickness direction of the display panel are elongated, an edge of the stretchable region away from the display region includes an arc-shaped edge, and extending directions of the first holes are perpendicular to the arc-shaped edge.

In some embodiments, the display panel includes: a dam, where sections of the first holes perpendicular to a thickness direction of the display panel are elongated, and extending directions of the first holes are perpendicular to an extending direction of the dam.

In some embodiments, the sections of the first holes perpendicular to the thickness direction of the display panel are rectangular, wavy or sawtooth.

In some embodiments, the first holes pass through an entire thickness or a partial thickness of the display panel.

In some embodiments, the first holes include first sub-holes and second sub-holes in a thickness direction of the display panel, an organic material layer is provided between the first sub-holes and the second sub-holes, and for each of the first holes, symmetry axes of a first sub-hole and a second sub-hole coincide.

In some embodiments, the stretchable region includes an organic substrate, and a first gate insulating layer, a second gate insulating layer, an interlayer dielectric layer, a first passivation layer, and a first planarization layer sequentially stacked on the organic substrate, and the first holes pass through the first gate insulating layer, the second gate insulating layer, the interlayer dielectric layer, the first passivation layer, and the first planarization layer.

In some embodiments, the first planarization layer is provided with first grooves near the first holes, a second passivation layer is disposed on a side of the first planarization layer outside the first grooves away from the organic substrate, the second passivation layer includes first sections close to the first holes and second sections away from the first holes, and the first sections cover entire sidewalls of the first planarization layer.

In some embodiments, the display panel includes: an organic substrate, where the first holes pass through an entire thickness or a partial thickness of the organic substrate.

In some embodiments, the display region includes pixel structure regions and wiring regions that are alternately arranged, and second holes are provided between adjacent pixel structure region and wiring region.

In some embodiments, the second holes pass through an entire thickness or a partial thickness of the display panel.

In some embodiments, the second holes include third sub-holes and fourth sub-holes in a thickness direction of the display panel, an organic material layer is provided between the third sub-holes and the fourth sub-holes, and for each of the second holes, symmetry axes of a third sub-hole and a fourth sub-hole coincide.

In some embodiments, the display panel includes: an organic substrate, where the second holes pass through an entire thickness or a partial thickness of the organic substrate.

In some embodiments, a density of the first holes is greater than a density of the second holes.

According to a second aspect of the embodiments of the present disclosure, there is provided a display device, including: a display panel as described above.

For the problem of wavy wrinkles in the related art, inventors analyzed and found that its reason lies in: stretchable regions located in corner regions are provided with a plurality of organic and inorganic film layers, which mutually have a compression stress there-between. When the compression stress cannot be released, accumulation of the compression stress will cause the wavy wrinkles.

Based on the analysis, in the embodiments of the present disclosure, by providing a plurality of first holes in a stretchable region, organic and inorganic film layers in partial regions are removed, so that stress relief spaces can be formed, thereby solving the problem of wavy wrinkles.

It should be understood that the above general description and the following detailed description are only exemplary and explanatory and are not restrictive of the present disclosure.

BRIEF DESCRIPTION OF THE DRAWINGS

The accompanying drawings, which are incorporated in and constitute a part of this specification, illustrate examples consistent with the present disclosure and, together with the description, serve to explain the principles of the disclosure.

LIST OF REFERENCE NUMERALS

Figure 1:
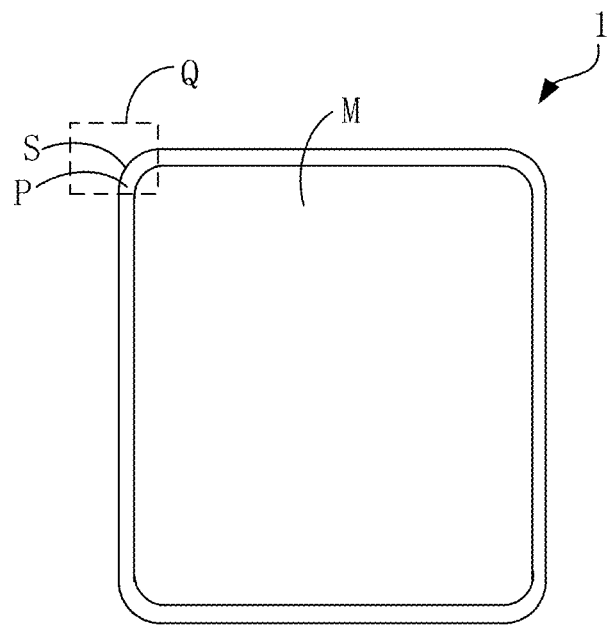
FIG. 1 is a top view illustrating a display panel according to a first embodiment of the present disclosure.

| | |
|---|---|
| Display panels 1, 3, 4 | Stretchable region P |
| Edge S | Display region M |
| First hole H1 | Second hole H2 |
| Pixel structure region M1 | Wiring region M2 |
| Organic substrate 10 | Buffer layer 11 |
| Active layer 12 | First gate insulating layer GI1 |
| Gate electrode 13 | Second gate insulating layer GI2 |
| Source electrode 14a | Drain electrode 14b |
| Interlayer dielectric layer ILD | First passivation layer PVX1 |
| First planarization layer PLN1 | Source transfer electrode 15a |
| Drain transfer electrode 15b | Second planarization layer PLN2 |
| Pixel definition layer PDL | Pixel structure 16 |
| Anode 16a | OLED light-emitting block 16b |
| Cathode 16c | First inorganic encapsulation layer 171 |
| Organic encapsulation layer 172 | Second inorganic encapsulation layer 173 |
| Gate line WL | Carrier plate 2 |
| Dam 20 | First sub-hole H11 |
| Second sub-hole H12 | Placeholder material layer 30 |
| Second passivation layer PVX2 | |

DETAILED DESCRIPTION OF THE EMBODIMENTS

Examples will be described in detail herein, with the illustrations thereof represented in the drawings. When the following descriptions involve the drawings, like numerals in different drawings refer to like or similar elements unless otherwise indicated. The embodiments described in the following examples do not represent all embodiments consistent with the present disclosure. Rather, they are merely examples of apparatuses and methods consistent with some aspects of the present disclosure as detailed in the appended claims.

Figure 2:
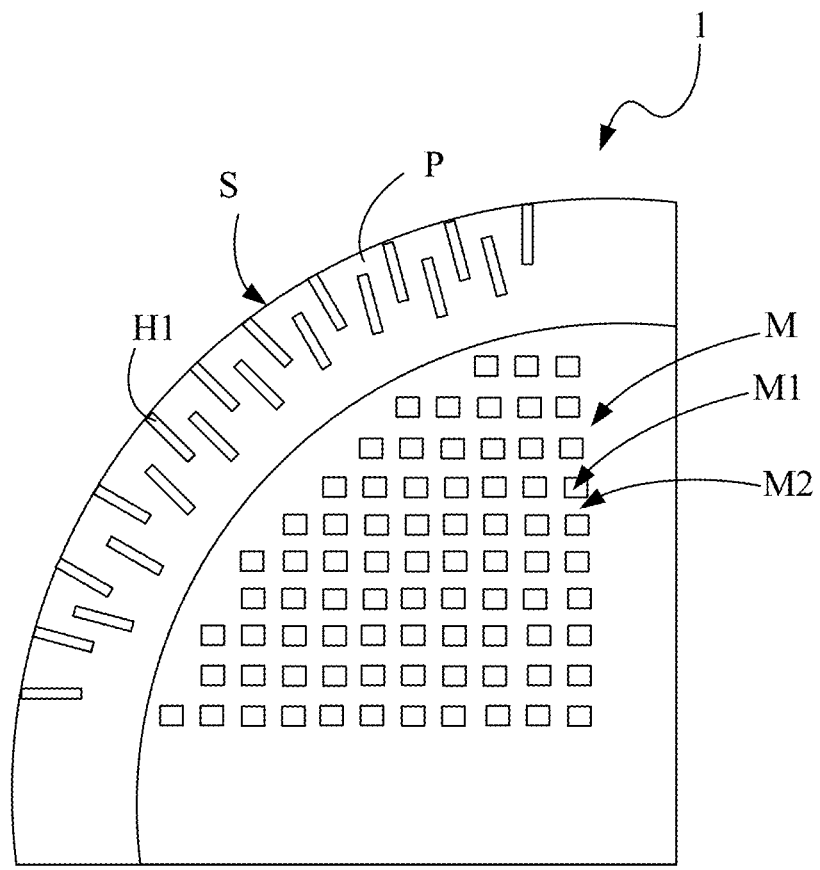
FIG. 2 is an enlarged view illustrating a Q region in FIG. 1.

FIG. 1 is a top view illustrating a display panel according to a first embodiment of the present disclosure. FIG. 2 is an enlarged view illustrating a Q region in FIG. 1.

Referring to FIG. 1 and FIG. 2, a display panel 1 includes a display region M and a stretchable region P located in at least one corner region. The stretchable region P is provided with a plurality of first holes H1. The first holes H1 are staggered from each other. In other words, the first holes H1 do not overlap with each other.

Referring to FIG. 1, the display panel 1 can have four corner regions, each of which has a stretchable region P.

In this embodiment, referring to FIG. 2, sections of the first holes H1 perpendicular to a thickness direction of the display panel 1 are elongated, an edge S of the stretchable region P away from the display region M includes an arc-shaped edge S, and extending directions of the first holes H1 are perpendicular to the arc-shaped edge S. In some embodiments, the sections of the first holes H1 perpendicular to the thickness direction of the display panel 1 are rectangular. In other embodiments, the sections of the first holes H1 perpendicular to the thickness direction of the display panel 1 may be wavy or sawtooth. In some embodiments, corners of rectangular sections may be rounded.

In other embodiments, the sections of the first holes H1 perpendicular to the thickness direction of the display panel 1 may be circular, elliptical, rhombic, or the like.

Referring to FIG. 2, in this embodiment, the display region M in the display panel 1 includes pixel structure regions M1 and wiring regions M2 that are alternately arranged.

Figure 3:
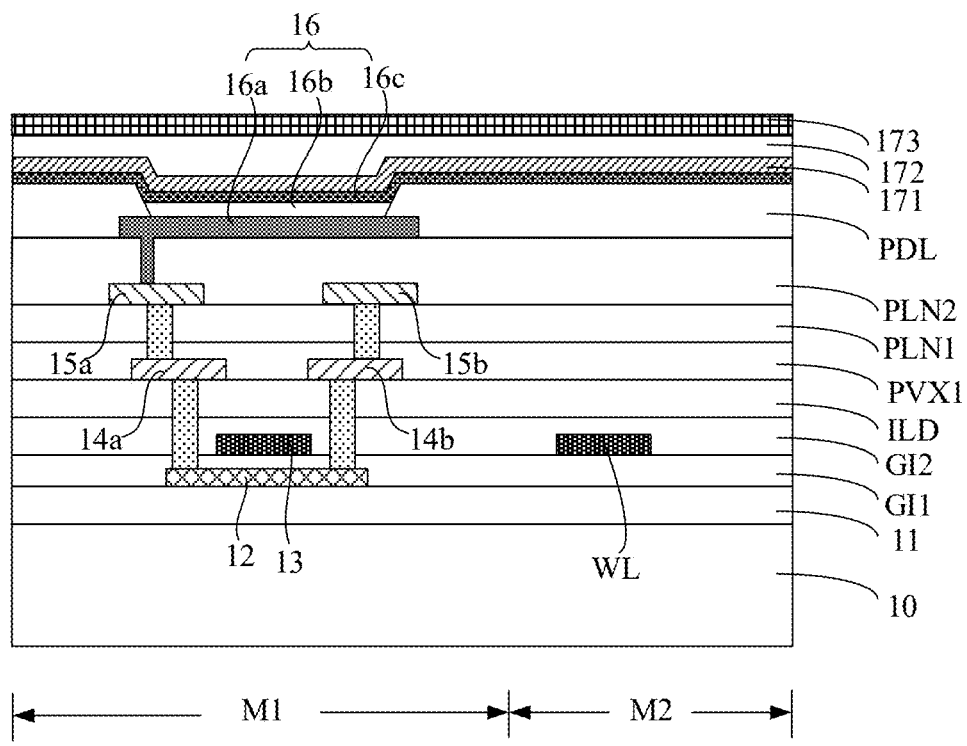
FIG. 3 is a sectional view illustrating a display region in FIG. 2 along a thickness direction of the display panel.

FIG. 3 is a sectional view illustrating the display region in FIG. 2 along the thickness direction of the display panel.

Referring to FIG. 3, a pixel structure region M1 is provided with a plurality of pixel structures 16 arranged in an array. Each of the pixel structures 16 includes: an anode 16a, a cathode 16c, and an OLED light-emitting block 16b disposed between the anode 16a and the cathode 16c. The OLED light-emitting block 16b may be red, green or blue light-emitting, or be red, green, blue or yellow light-emitting. The pixel structures 16 with three primary colors of red, green and blue or four primary colors of red, green, blue and yellow are alternately distributed.

Referring to FIG. 3, in this embodiment, a pixel driving circuit is disposed between the anode 16a and an organic substrate 10, the pixel driving circuit includes a plurality of transistors, and the anode 16a is electrically connected with a source electrode of a transistor. In other words, the pixel structures 16 are Active Matrix OLEDs (AMOLEDs).

The AMOLEDs use a transistor array to control each pixel to emit light, and each pixel can emit light continuously. That is, addressing of each pixel structure 16 is directly controlled by the transistor array:

Each transistor in the pixel driving circuit includes: an active layer 12, a first gate insulating layer GI1, a gate electrode 13, a second gate insulating layer GI2, a source electrode 14a, and a drain electrode 14b. The active layer 12 includes a source region, a drain region, and a channel region located between the source region and the drain region. The first gate insulating layer GI1 and the second gate insulating layer GI2 are each disposed as a unitary layer in the display region M. An interlayer dielectric layer ILD is disposed on a whole side of the second gate insulating layer GI2 away from the organic substrate 10. The source electrode 14a and the drain electrode 14b are disposed on a side of the interlayer dielectric layer ILD away from the organic substrate 10. The source electrode 14a and the drain electrode 14b are respectively connected with a source region and a drain region through corresponding conductive plugs. A first passivation layer PVX1 is disposed as a unitary layer on a side of the source electrode 14a, the drain electrode 14b and the interlayer dielectric layer ILD away from the organic substrate 10. A first planarization layer PLN1 is disposed on a whole side of the first passivation layer PVX1 away from the organic substrate 10. A source transfer electrode 15a and a drain transfer electrode 15b are disposed on a side of the first planarization layer PLN1 away from the organic substrate 10. The source transfer electrode 15a and the drain transfer electrode 15b are respectively connected with the source electrode 14a and the drain electrode 14b through corresponding conductive plugs. A second planarization layer PLN2 is disposed as a unitary layer on a side of the source transfer electrode 15a, the drain transfer electrode 15b and the first planarization layer PLN1 away from the organic substrate 10. A plurality of anodes 16a are disposed on the second planarization layer PLN2. The anode 16a is connected with the source transfer electrode 15a through a corresponding conductive plug. A pixel definition layer PDL is disposed on a side of the anodes 16a and the second planarization layer PLN2 away from the organic substrate 10. The pixel definition layer PDL has openings exposing a partial region of the anodes 16a.

The OLED light-emitting block 16b is located in the opening of the pixel definition layer PDL. The cathode 16c is located on a side of the OLED light-emitting block 16b away from the organic substrate 10. Cathodes 16c of respective pixel structures 16 can be connected with each other to form a planar electrode.

An encapsulation layer is disposed on the cathode planar electrode. In this embodiment, the encapsulation layer includes a first inorganic encapsulation layer 171, a second inorganic encapsulation layer 173, and an organic encapsulation layer 172 located between the first inorganic encapsulation layer 171 and the second inorganic encapsulation layer 173.

In this embodiment, the active layer 12 is close to the organic substrate 10, and the gate electrode 13 is far away from the organic substrate 10. Therefore, the transistor has a top-gate structure. In other embodiments, the transistor may have a bottom-gate structure, and relative to the active layer 12, the gate electrode 13 is close to the organic substrate 10.

Specific film layers and circuit structure of the pixel driving circuit are not limited in this embodiment. In some embodiments, the first passivation layer PVX1 may be located on a side of the second planarization layer PLN2 away from the organic substrate 10. In some embodiments, the first passivation layer PVX1 may not be included. In some embodiments, the second planarization layer PLN2 or the first planarization layer PLN1 may not be included.

In other embodiments, the pixel structures 16 may be Passive Matrix OLEDs. In this case, the pixel structure regions M1 have no pixel driving circuit.

In this embodiment, the organic substrate 10 may be made of polyimide. A buffer layer 11 can be disposed on a whole surface of the organic substrate 10. The buffer layer 11 may be made of silicon dioxide, silicon nitride, silicon oxynitride, etc., so as to isolate water vapor or the like from diffusing upward from the organic substrate 10 to respective film layers.

Still referring to FIG. 3, in this embodiment, the wiring regions M2 may be provided with gate lines WL, data lines (not shown), power lines (not shown), and other connection lines connecting transistors in respective pixel structure regions M1. The gate lines WL may be located in a same layer as gate electrodes 13. In other words, the gate lines WL disposed in the wiring regions M2 and the gate electrodes 13 of the transistors in the pixel structure regions M1 can be manufactured simultaneously. The data lines and the power lines are arranged in parallel, and may be located in a same layer as source electrodes 14a and drain electrodes 14b. In other words, the data lines and the power lines disposed in the wiring regions M2 and the source electrodes 14a and the drain electrodes 14b of the transistors in the pixel structure regions M1 can be manufactured simultaneously.

Figure 4:
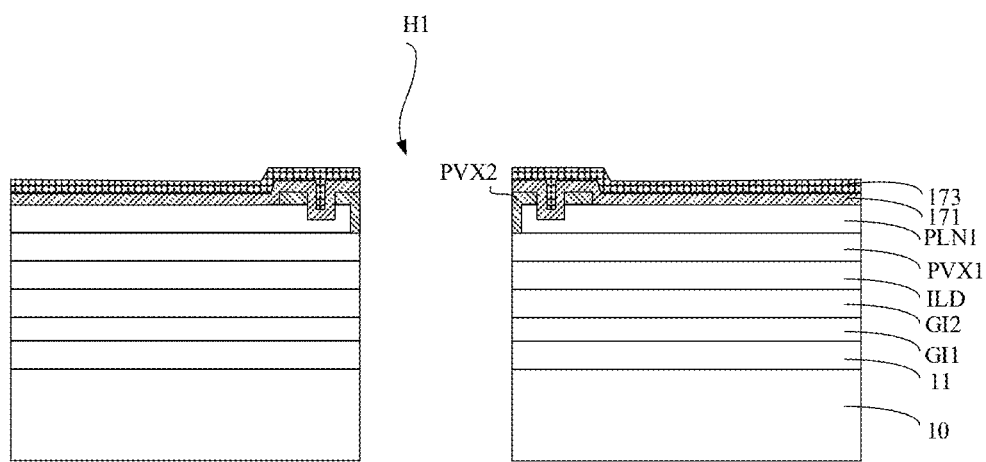
FIG. 4 is a sectional view illustrating a stretchable region in FIG. 2 along the thickness direction of the display panel.
Figure 5:
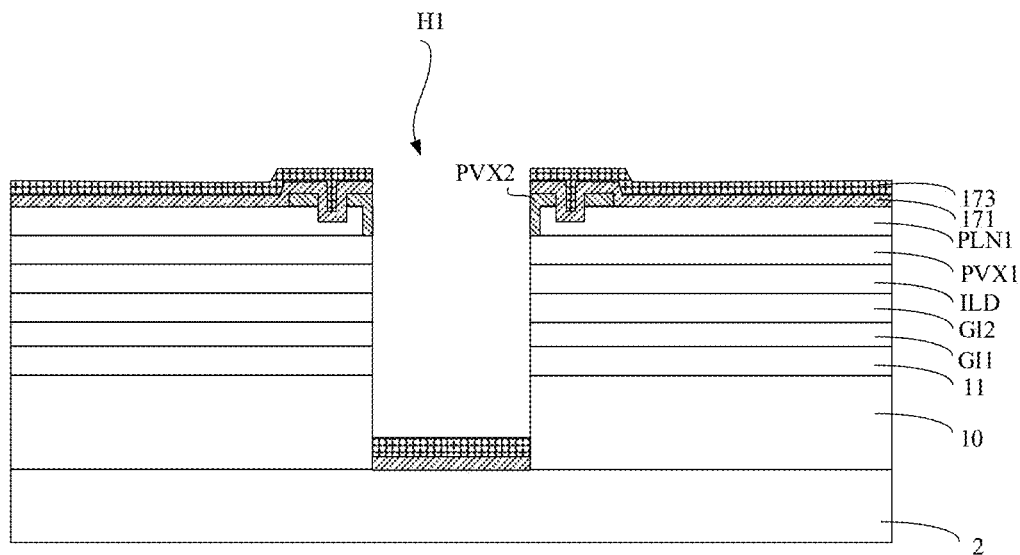
FIG. 5 is a schematic structural diagram illustrating the display panel in FIG. 4 in a manufacturing process.

FIG. 4 is a sectional view illustrating the stretchable region in FIG. 2 along the thickness direction of the display panel. FIG. 5 is a schematic structural diagram illustrating the display panel in FIG. 4 in a manufacturing process.

Referring to FIG. 4 and FIG. 5, in this embodiment, during the manufacturing of the display panel 1, the organic substrate 10 is carried on a carrier plate 2 such as a glass substrate.

Referring to FIG. 5, after the manufacturing of the pixel driving circuits and the pixel structures 16 is completed, a plurality of first holes H1 may be formed in the stretchable region P.

A length of each of the first holes H1 may be in a range of 250 μm~400 μm, and a width of each of the first holes H1 may be in a range of 8 μm~12 μm. A distance between centers of adjacent first holes H1 may be in a range of 300 μm~500 μm.

In this embodiment, a numerical range includes endpoint values and values that fluctuate up and down relative to the endpoint values and are within process and measurement error range.

By providing the first holes H1, organic and inorganic film layers in partial regions are removed, so that stress relief spaces can be formed, thereby solving the problem of wavy wrinkles.

The first holes H1 pass through the organic substrate 10, and the buffer layer 11, the first gate insulating layer GI1, the second gate insulating layer GI2, the interlayer dielectric layer ILD, the first passivation layer PVX1, and the first planarization layer PLN1 sequentially stacked on the organic substrate 10.

In manufacturing of the encapsulation layer, the first holes H1, due to relatively large depth to width ratio, can cut off and separate each of the first inorganic encapsulation layer 171 and the second inorganic encapsulation layer 173. That is, in this embodiment, the first holes H1 pass through the entire thickness of the display panel 1.

The organic encapsulation layer 172 may not be disposed in the stretchable region P by a region control of a printing process.

In addition, the first planarization layer PLN1 is provided with first grooves near the first holes H1. The first grooves can increase paths of water and oxygen entering the pixel structure regions M1 from the first holes H1. A second passivation layer PVX2 is disposed on the first planarization layer PLN1 outside the first grooves. The second passivation layer PVX2 includes first sections close to the first holes H1 and second sections away from the first holes H1. The first sections cover entire sidewalls of the first planarization layer PLN1 to further prevent water and oxygen from entering the first planarization layer PLN1 through the first holes H1. The first inorganic encapsulation layer 171 is in direct contact with the second passivation layer PVX2. The second sections cover partial surfaces of the PLN1.

When the manufacturing of the encapsulation layer is completed, referring to FIG. 4, the carrier plate 2 is peeled off.

Figure 6:
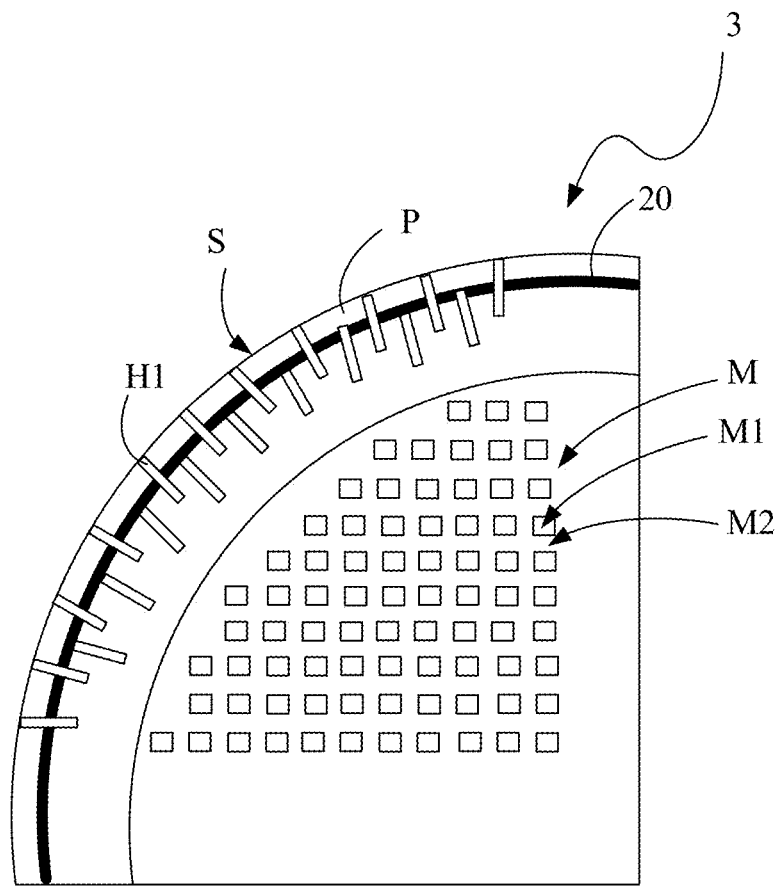
FIG. 6 is a top view illustrating a partial region of a display panel according to a second embodiment of the present disclosure.
Figure 7:
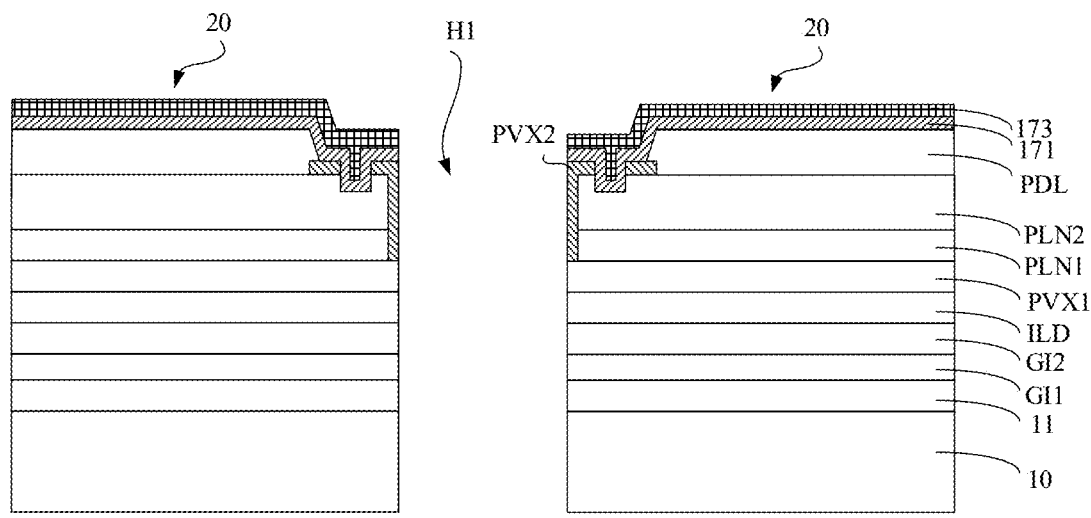
FIG. 7 is a sectional view illustrating a stretchable region in FIG. 6 along a thickness direction of the display panel.

FIG. 6 is a top view illustrating a partial region of a display panel according to a second embodiment of the present disclosure. FIG. 7 is a sectional view illustrating a stretchable region in FIG. 6 along a thickness direction of the display panel.

Referring to FIG. 6 and FIG. 7, a display panel 3 according to this embodiment is substantially the same as the display panel 1 in FIGS. 1 to 5, except that the display panel 3 includes a dam 20, sections of first holes H1 perpendicular to the thickness direction of the display panel 3 are elongated, and extending directions of the first holes H1 are perpendicular to an extending direction of the dam 20.

Referring to FIG. 7 and FIG. 4, at the dam 20 in the display panel 3, the second planarization layer PLN2 and the pixel definition layer PDL are sequentially disposed on a side of the first planarization layer PLN1 away from the organic substrate 10 to increase a height of the dam 20. The dam 20 may include at least one dam, and any one of the at least one dam may be composed of at least one of the first planarization layer PLN1, the second planarization layer PLN2 or the pixel definition layer PDL. In some embodiments, the display panel may include a support layer disposed on a side of the pixel definition layer PDL, and the support layer may constitute the dam 20.

In this embodiment, the first grooves are disposed near the first holes H1 in the second planarization layer PLN2. The second passivation layer PVX2 is disposed on the second planarization layer PLN2 outside the first grooves. The first sections of the second passivation layer PVX2 cover entire sidewalls of the second planarization layer PLN2 and the first planarization layer PLN1. The first inorganic encapsulation layer 171 is respectively in direct contact with the pixel definition layer PDL and the second passivation layer PVX2.

Figure 8:
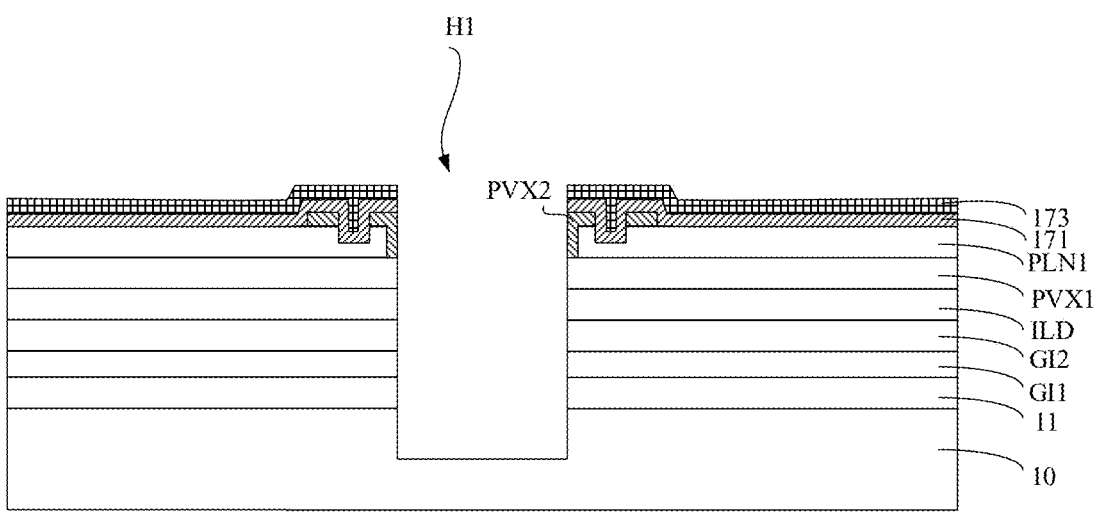
FIG. 8 is a sectional view illustrating a stretchable region in a display panel along a thickness direction of the display panel according to a third embodiment of the present disclosure.
Figure 9:
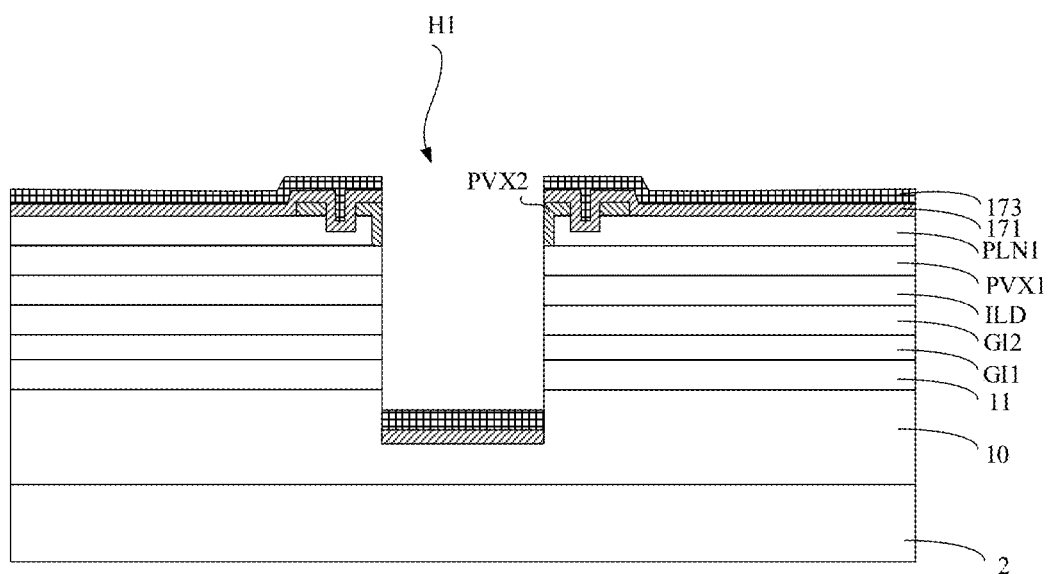
FIG. 9 is a schematic structural diagram illustrating the display panel in FIG. 8 in a manufacturing process.

FIG. 8 is a sectional view illustrating a stretchable region in a display panel along a thickness direction of the display panel according to a third embodiment of the present disclosure. FIG. 9 is a schematic structural diagram illustrating the display panel in FIG. 8 in a manufacturing process.

Referring to FIG. 8 and FIG. 9, the display panel according to this embodiment is substantially the same as the display panels 1, 3 in FIGS. 1 to 7, except that the first holes H1 pass through a partial thickness of the organic substrate 10. Advantages lie in that: referring to FIG. 9, in manufacturing of an encapsulation layer, the organic substrate 10 at the bottom of the first holes H1 can isolate the first inorganic encapsulation layer 171 from the carrier plate 2; thus, when the carrier plate 2 is peeled off, incomplete display panel due to breakage of some organic or inorganic film layers caused by a larger bonding force between the first inorganic encapsulation layer 171 and the carrier plate 2 can be avoided.

In other embodiments, an entire thickness of the organic substrate 10 at the bottom of the first holes H1 may be retained, or one or more film layer structures on the organic substrate 10 are retained.

Figure 10:
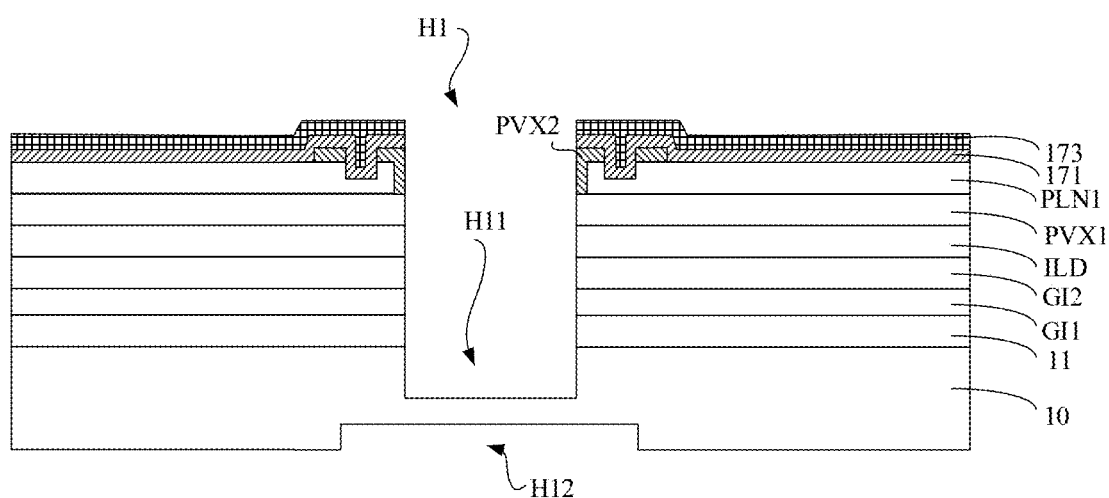
FIG. 10 is a sectional view illustrating a stretchable region in a display panel along a thickness direction of the display panel according to a fourth embodiment of the present disclosure.

FIG. 10 is a sectional view illustrating a stretchable region in a display panel along a thickness direction of the display panel according to a fourth embodiment of the present disclosure.

Referring to FIG. 10, the display panel according to this embodiment is substantially the same as the display panel shown in FIGS. 8 to 9, except that the first holes H1 include first sub-holes H11 and second sub-holes H12 in the thickness direction of the display panel, where an organic material layer is provided between the first sub-holes H11 and the second sub-holes H12, and for each of the first holes H1, symmetry axes of a first sub-hole H11 and a second sub-hole H12 coincide. The symmetry axes of the first sub-holes H11 and the second sub-holes H12 are along the thickness direction of the display panel. Advantages lie in that: when the display panel is attached with other modules, such as a glass cover plate, the first sub-holes H11 and the second sub-holes H12 form buffer space respectively above and below the organic material layer, which improves the deformability and can prevent that excessive stress accumulation causes organic or inorganic film layers of the display panel to break.

In this embodiment, for each of the first holes H1, a width of the first sub-hole H11 is smaller than that of the second sub-hole H12. In other embodiments, the width of the first sub-hole H11 may be greater than or equal to that of the second sub-hole H12. In some embodiments, the first sub-hole H11 and the second sub-hole H12 may partially overlap.

In this embodiment, the organic material layer is a part of the organic substrate. In other embodiments, the organic material layer may be other organic film layers.

Figure 11:
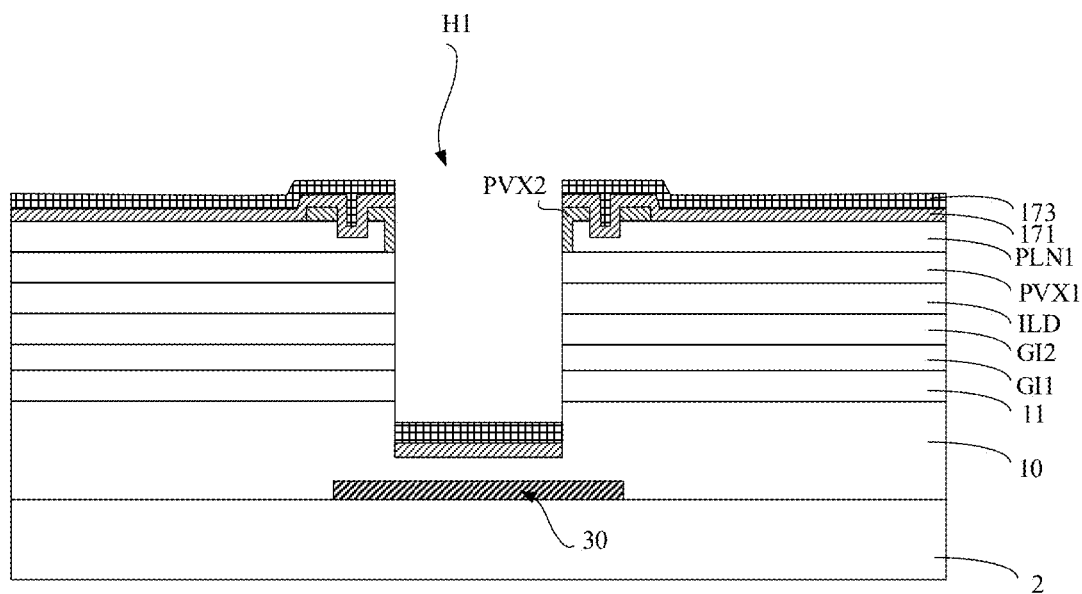
FIG. 11 is a schematic structural diagram illustrating the display panel shown in FIG. 10 in a manufacturing process.

FIG. 11 is a schematic structural diagram illustrating the display panel shown in FIG. 10 in a manufacturing process. Referring to FIG. 11, during the manufacturing of the display panel, a placeholder material layer 30 can be first formed on the carrier plate 2. The placeholder material layer 30 may be made of silicon nitride, silicon dioxide, metal, etc. After the carrier plate 2 is peeled off, the placeholder material layer 30 is attached to the carrier plate 2.

Figure 12:
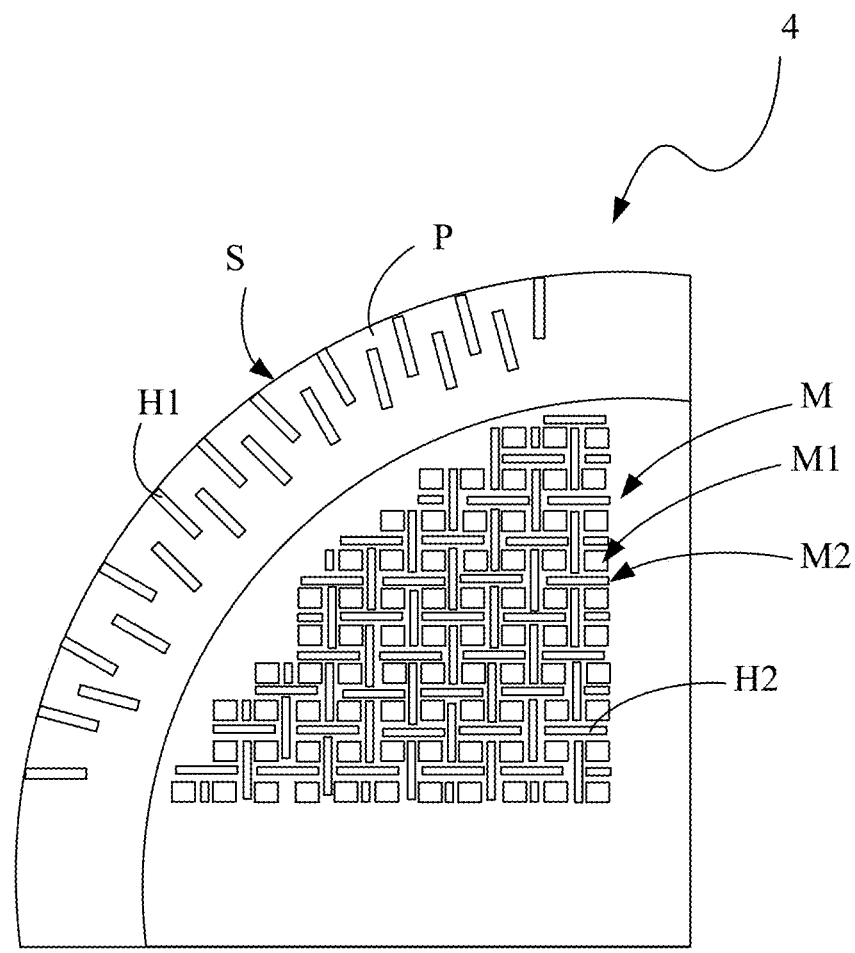
FIG. 12 is a top view illustrating a partial region of a display panel according to a fifth embodiment of the present disclosure.
Figure 13:
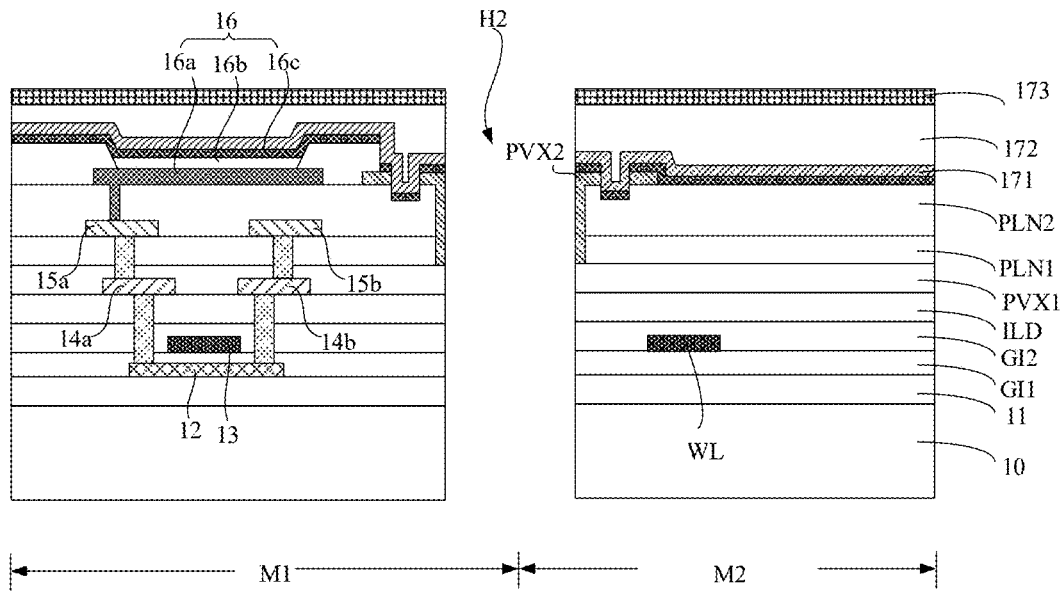
FIG. 13 is a sectional view illustrating a display region in FIG. 12 along a thickness direction of the display panel.

FIG. 12 is a top view illustrating a partial region of a display panel according to a fifth embodiment of the present disclosure. FIG. 13 is a sectional view illustrating a display region in FIG. 12 along a thickness direction of the display panel.

Referring to FIG. 12 and FIG. 13, a display panel 4 according to this embodiment is substantially the same as the display panels in FIGS. 1 to 11, except that second holes H2 are provided between adjacent pixel structure region M1 and wiring region M2.

A density of the second holes H2 may be smaller than that of the first holes H1. The density of the first holes H1 refers to an area of all the first holes H1 in a unit area. The density of the second holes H2 refers to an area of all the second holes H2 in a unit area.

The provision of the second holes H2, when the display panel is attached with other modules, such as a glass cover plate, can improve the deformability of the display panel and prevent inorganic or organic film layers from tearing/breaking. The second holes H2 may be manufactured in the same process as the first holes H1.

Figure 14:
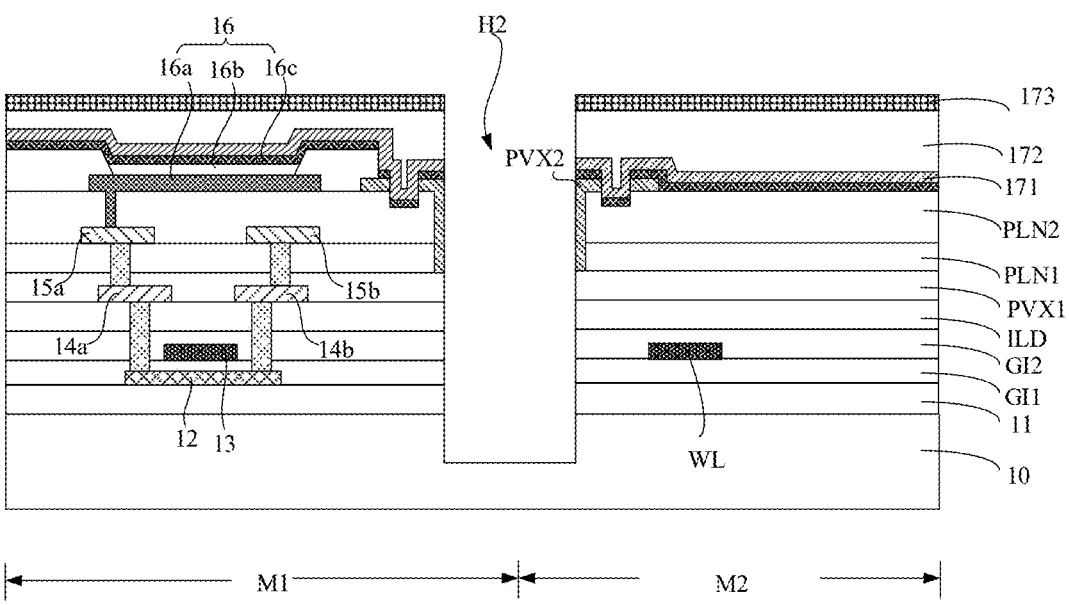
FIG. 14 is another sectional view illustrating a display region in FIG. 12 along a thickness direction of the display panel.

In the embodiment shown in FIG. 13, the second holes H2 may pass through an entire thickness of the organic substrate 10 or the display panel 4. In the embodiment shown in FIG. 14, the second holes H2 may pass through a partial thickness of the organic substrate 10 or the display panel 4.

Figure 15:
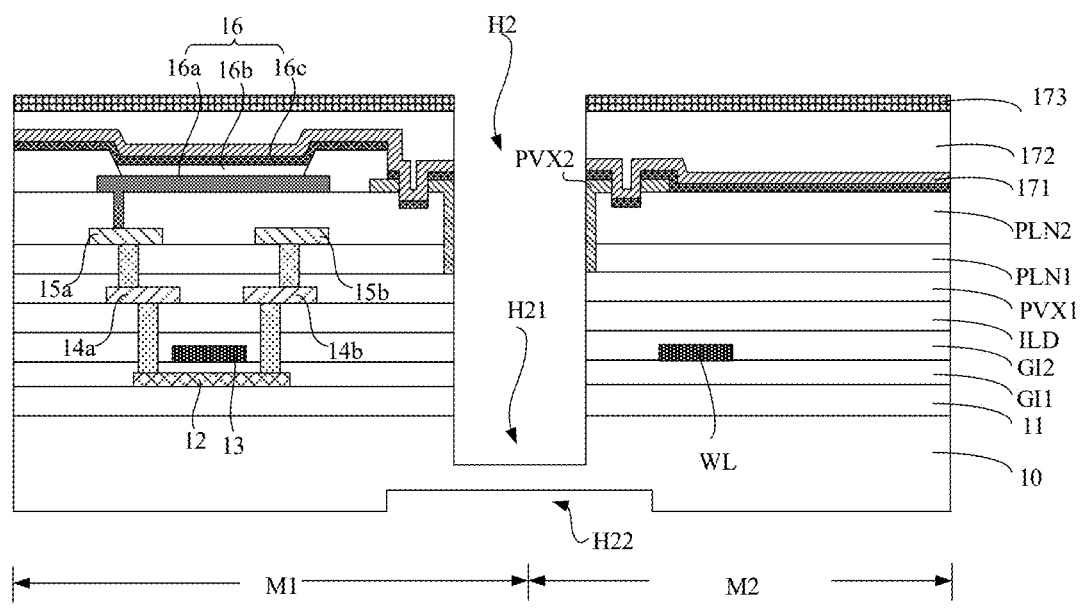
FIG. 15 is yet another sectional view illustrating a display region in FIG. 12 along a thickness direction of the display panel.

In the embodiment shown in FIG. 15, the second holes H2 may include third sub-holes H21 and fourth sub-holes H22 in a thickness direction of the display panel 4, where an organic material layer is provided between the third sub-holes H21 and the fourth sub-holes H22, and for each of the second holes H2, symmetry axes of a third sub-hole H21 and a fourth sub-hole H22 coincide. The symmetry axes of the third sub-holes H21 and the fourth sub-holes H22 are along the thickness direction of the display panel 4. In this embodiment, the organic material layer has a partial thickness of the organic substrate 10. In other embodiments, the organic material layer may be other organic film layers.

In this embodiment, the second planarization layer PLN2 is provided with second grooves near the second holes H2. The second grooves can disconnect a cathode planar electrode vapor deposited subsequently, and thus can increase paths of water and oxygen entering pixel structure regions M1 and wiring regions M2 from the second holes H2. The second passivation layer PVX2 is disposed on the second planarization layer PLN2 outside the second grooves. The second passivation layer PVX2 includes first sections close to the second holes H2 and second sections away from the second holes H2. The first sections cover entire sidewalls of the second planarization layer PLN2 and the first planarization layer PLN1 to further prevent water and oxygen from entering the first planarization layer PLN1 and the second planarization layer PLN2 through the second holes H2. The first inorganic encapsulation layer 171 is in direct contact with the cathode planar electrode.

Based on the above-described display panels, in an embodiment of the present disclosure, there is provided a display device including any one of the display panels. The display device can be any product or component having a display function, such as electronic paper, a mobile phone, a tablet computer, a television, a notebook computer, a digital photo frame, or a navigator.

It should be pointed out that, in the drawings, sizes of layers and regions may be exaggerated for clarity of illustration. It will also be understood that when an element or layer is referred to as being "on" another element or layer, it can be directly on other element, or an intermediate layer may be present. In addition, it will be understood that when an element or layer is referred to as being "below" another element or layer, it can be directly below other element, or more than one intermediate layer or element may be present. It will also be understood that when a layer or element is referred to as being "between" two layers or elements, it can be the only layer between the two layers or elements, or more than one intermediate layer or element may be present. Similar reference numerals indicate similar elements throughout.

In the present disclosure, terms "first" and "second" are used only for descriptive purposes, and cannot be understood as indicating or implying relative importance. Terms "plurality" and "multiple" refer to one, two or more, unless clearly defined otherwise.

Other embodiments of the present disclosure will be readily apparent to those skilled in the art after considering the specification and practicing the contents disclosed herein. The present disclosure is intended to cover any variations, uses, or adaptations of the present disclosure, which follow the general principle of the present disclosure and include common knowledge or conventional technical means in the art that are not disclosed in the present disclosure. The specification and examples are to be regarded as illustrative only. The true scope and spirit of the present disclosure are pointed out by the following claims.

It is to be understood that the present disclosure is not limited to the precise structures that have described and shown in the drawings, and various modifications and changes can be made without departing from the scope thereof. The scope of the disclosure is to be limited only by the appended claims.

The invention claimed is:

1. A display panel, comprising: a display region and a stretchable region located in at least one corner region, wherein the stretchable region is provided with a plurality of first holes, and the first holes are staggered from each other;
    wherein the display region comprises pixel structure regions and wiring regions that are alternately arranged, and second holes are provided between adjacent pixel structure region and wiring region;
    wherein a density of the first holes is greater than a density of the second holes.

2. The display panel according to claim 1, wherein sections of the first holes perpendicular to a thickness direction of the display panel are elongated, an edge of the stretchable region away from the display region comprises an arc-shaped edge, and extending directions of the first holes are perpendicular to the arc-shaped edge.

3. The display panel according to claim 1, further comprising: a dam, wherein sections of the first holes perpendicular to a thickness direction of the display panel are elongated, and extending directions of the first holes are perpendicular to an extending direction of the dam.

4. The display panel according to claim 1, wherein the sections of the first holes perpendicular to a thickness direction of the display panel are rectangular, wavy or sawtooth.

5. The display panel according to claim 1, wherein the first holes pass through an entire thickness or a partial thickness of the display panel.

6. The display panel according to claim 5, wherein the first holes comprise first sub-holes and second sub-holes in a thickness direction of the display panel, an organic material layer is provided between the first sub-holes and the second sub-holes, and
    for each of the first holes, symmetry axes of a first sub-hole and a second sub-hole coincide.

7. The display panel according to claim 5, wherein the stretchable region comprises an organic substrate, and a first gate insulating layer, a second gate insulating layer, an interlayer dielectric layer, a first passivation layer, and a first planarization layer sequentially stacked on the organic substrate, and the first holes pass through the first gate insulating layer, the second gate insulating layer, the interlayer dielectric layer, the first passivation layer, and the first planarization layer.

8. The display panel according to claim 7, wherein the first planarization layer is provided with first grooves near the first holes, a second passivation layer is disposed on a side of the first planarization layer outside the first grooves away from the organic substrate, the second passivation layer comprises first sections close to the first holes and second sections away from the first holes, and the first sections cover entire sidewalls of the first planarization layer.

9. The display panel according to claim 5, further comprising: an organic substrate, wherein the first holes pass through an entire thickness or a partial thickness of the organic substrate.

10. The display panel according to claim 1, wherein the second holes pass through an entire thickness or a partial thickness of the display panel.

11. The display panel according to claim 10, wherein the second holes comprise third sub-holes and fourth sub-holes in a thickness direction of the display panel, an organic material layer is provided between the third sub-holes and the fourth sub-holes, and
    for each of the second holes, symmetry axes of a third sub-hole and a fourth sub-hole coincide.

12. The display panel according to claim 10, further comprising: an organic substrate, wherein the second holes pass through an entire thickness or a partial thickness of the organic substrate.

13. A display device, comprising a display panel, the display panel comprises a display region and a stretchable region located in at least one corner region, wherein the stretchable region is provided with a plurality of first holes, and the first holes are staggered from each other;
  wherein the display region comprises pixel structure regions and wiring regions that are alternately arranged, and second holes are provided between adjacent pixel structure region and wiring region;
  wherein a density of the first holes is greater than a density of the second holes.

14. The display device according to claim 13, wherein sections of the first holes perpendicular to a thickness direction of the display panel are elongated, an edge of the stretchable region away from the display region comprises an arc-shaped edge, and extending directions of the first holes are perpendicular to the arc-shaped edge.

15. The display device according to claim 13, the display panel further comprises a dam, wherein sections of the first holes perpendicular to a thickness direction of the display panel are elongated, and extending directions of the first holes are perpendicular to an extending direction of the dam.

16. The display device according to claim 13, wherein the sections of the first holes perpendicular to athickness direction of the display panel are rectangular, wavy or sawtooth.

17. The display device according to claim 13, wherein the first holes pass through an entire thickness or a partial thickness of the display panel.

18. The display device according to claim 17, wherein the first holes comprise first sub-holes and second sub-holes in a thickness direction of the display panel, an organic material layer is provided between the first sub-holes and the second sub-holes, and
  for each of the first holes, symmetry axes of a first sub-hole and a second sub-hole coincide.

* * * * *